United States Patent
Onishi et al.

(10) Patent No.: US 10,026,879 B2
(45) Date of Patent: Jul. 17, 2018

(54) METHOD OF MANUFACTURING LIGHT EMITTING ELEMENT

(71) Applicant: NICHIA CORPORATION, Anan-shi, Tokushima (JP)

(72) Inventors: Masahiko Onishi, Anan (JP); Yasuhiro Miki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/979,990

(22) Filed: Dec. 28, 2015

(65) Prior Publication Data

US 2016/0190394 A1 Jun. 30, 2016

(30) Foreign Application Priority Data

Dec. 26, 2014 (JP) .................. 2014-266065

(51) Int. Cl.
*H01L 33/00* (2010.01)
*H01L 33/56* (2010.01)
(Continued)

(52) U.S. Cl.
CPC .............. *H01L 33/56* (2013.01); *H01L 33/44* (2013.01); *H01L 33/58* (2013.01);
(Continued)

(58) Field of Classification Search
CPC ......... H01L 33/42; H01L 33/32; H01L 33/06; H01L 33/44; H01L 33/56;
(Continued)

(56) References Cited

U.S. PATENT DOCUMENTS 6,333,522 B1 * 12/2001 Inoue ................. H01L 33/32
257/81
6,969,873 B2 * 11/2005 Hata .................. H01L 33/20
257/94
(Continued)

FOREIGN PATENT DOCUMENTS

JP 11-97738 A 4/1999
JP 2003-133590 A 5/2003
(Continued)

*Primary Examiner* — Nikolay Yushin
(74) *Attorney, Agent, or Firm* — Squire Patton Boggs (US) LLP

(57) ABSTRACT

A light emitting element includes an n-type semiconductor layer having an upper surface; a p-type semiconductor layer over a portion of the upper surface of the n-type semiconductor layer, the p-type semiconductor layer having an upper surface; a protective film continuously covering the n-type semiconductor layer and the p-type semiconductor layer, the protective film defining an n-side opening at the upper surface of the n-type semiconductor layer and a p-side opening at an upper surface of the p-type semiconductor layer; a p-side electrode on the upper surface of the p-type semiconductor layer that is exposed in the p-side opening; an n-side electrode on the upper surface of the n-type semiconductor layer that is exposed at the n-side opening, n-side electrode having an n-side light-transmissive electrode; and an n-side pad electrode on the upper surface of the n-side light-transmissive electrode.

6 Claims, 11 Drawing Sheets

(51) Int. Cl.
*H01L 33/44* (2010.01)
*H01L 33/58* (2010.01)

(52) U.S. Cl.
CPC ............... *H01L 2224/48091* (2013.01); *H01L 2224/48247* (2013.01); *H01L 2224/48257* (2013.01); *H01L 2224/73265* (2013.01); *H01L 2924/181* (2013.01)

(58) Field of Classification Search
CPC ..... H01L 2933/0016; H01L 2933/0025; H01L 2933/0066; H01L 2924/00014; H01L 2924/00; H01L 21/823842; H01L 2/823864; H01L 21/823814; H01S 5/02276; H01S 5/0425; H01S 5/2231
See application file for complete search history.

(56) References Cited

U.S. PATENT DOCUMENTS

| | | | |
|---|---|---|---|
| 7,375,383 B2* | 5/2008 | Nakamura | H01L 21/28575 257/100 |
| 7,947,996 B2* | 5/2011 | Sakamoto | H01L 33/382 257/77 |
| 9,024,340 B2* | 5/2015 | Minato | H01L 33/505 257/98 |
| 2001/0042860 A1* | 11/2001 | Hata | H01L 33/20 257/21 |
| 2005/0212002 A1 | 9/2005 | Sanga et al. | |
| 2006/0121642 A1 | 6/2006 | Liu et al. | |
| 2007/0166861 A1 | 7/2007 | Jeon et al. | |
| 2007/0178689 A1* | 8/2007 | Nakamura | H01L 21/28575 438/615 |
| 2008/0185606 A1 | 8/2008 | Sane et al. | |
| 2009/0294791 A1 | 12/2009 | Miki | |
| 2010/0320479 A1* | 12/2010 | Minato | H01L 33/56 257/88 |
| 2012/0295373 A1 | 2/2012 | Bando et al. | |
| 2013/0037850 A1* | 2/2013 | Kafuku | H01L 33/44 257/100 |
| 2013/0292718 A1* | 11/2013 | Chu | H01L 27/153 257/93 |
| 2014/0014998 A1 | 1/2014 | Ohno | |

FOREIGN PATENT DOCUMENTS

| | | |
|---|---|---|
| JP | 2005-317931 A | 11/2005 |
| JP | 2007-73789 A | 3/2007 |
| JP | 2007-184597 A | 7/2007 |
| JP | 2008-210903 A | 9/2008 |
| JP | 2009-088299 A | 4/2009 |
| JP | 2009-164423 A | 7/2009 |
| JP | 2011-082589 A | 4/2011 |
| JP | 2012-243954 A | 12/2012 |
| JP | 2013-102192 A | 5/2013 |
| WO | WO 2009/102032 A1 | 8/2009 |
| WO | WO 2013/157176 A1 | 10/2013 |

* cited by examiner

METHOD OF MANUFACTURING LIGHT EMITTING ELEMENT

CROSS-REFERENCE TO RELATED APPLICATION

This application claims priority to Japanese Patent Application No. 2014-266065 filed on Dec. 26, 2014. The entire disclosure of Japanese Patent Application No. 2014-266,065 is hereby incorporated herein by reference.

BACKGROUND

1. Technical Field

The present disclosure relates to a light emitting element and a light emitting device using the light emitting element, and a method of manufacturing the same.

2. Description of Related Art

Light emitting elements such as light emitting diodes (LEDs) and laser diodes (LDs) are generally used in a wide area of applications such as various light sources of backlight or the like, lighting, signaling devices, large-size display devices. Such light emitting elements includes a type in which positive and negative electrodes are arranged on one surface (upper surface) of the light emitting element and a type in which positive and negative electrodes are arranged on different surfaces (upper surface and lower surface) of the light emitting element.

Of those light emitting elements, FIG. 13 to FIG. 20 illustrate the steps of manufacturing a light emitting element 130 that is the type in which the positive and negative electrodes are arranged on one surface. First, as shown in the schematic cross-sectional view of FIG. 13, a semiconductor stacked-layer body is formed stacking an n-type semiconductor layer 131, an active layer 138, and a p-type semiconductor layer 132 in this order on a growth substrate 140 such as a sapphire substrate. Next, as shown in FIG. 14, in order to partially expose the n-type semiconductor layer 131, a portion of the semiconductor stacked-layer body is removed from the upper surface of the p-type semiconductor layer 132 by way of etching or the like.

Next, a light-transmissive electrode such as ITO is disposed. In the present embodiment, as shown in FIG. 15, an ITO layer 139 is formed on approximately entire upper surfaces of the semiconductor stacked layer body. Then, as shown in FIG. 16, a resist film RI is formed on predetermined portions of the upper surface of the ITO layer 139. In this state, etching is carried out to remove the ITO layer 139 from portions other than the predetermined portions of the ITO layer 139 to form an n-side light-transmissive electrode 133 and a p-side light-transmissive electrode 134, as shown in FIG. 17. Then, as shown in FIG. 18, the resist film RI is removed, and as shown in FIG. 19, an n-side pad electrode 135 and a p-side pad electrode 136 are formed. Further, another resist film is disposed and as shown in FIG. 20, a protective film 137 such as $SiO_2$ is formed.

In this method, as shown in FIG. 20, the protective film 137 such as $SiO_2$ remains on the light-transmissive electrodes 133 and 134. Thus, light propagating from the active layer 138 may be hindered by the interfaces between the light transmissive electrodes 133, 134 and the protective film 137, which may result in reduction of the light extraction efficiency. Also, in manufacturing of the light emitting elements, a resist film RI that is used in forming the light-transmissive electrodes 133, 134 and a resist film that is used in forming the protective film 137 are needed to be respectively provided, which complicates manufacturing. See JP 2007-184,597A; and JP 2011-82,589A.

Accordingly, an object of embodiments of the present invention is to provide a light emitting element with further improved light extraction efficiency and simplified manufacturing, and to provide a light emitting device that uses the light emitting element and a method of manufacturing the same.

SUMMARY

A light emitting element according to certain embodiments of the present invention may include an n-type semiconductor layer having an upper surface; a p-type semiconductor layer over a portion of the upper surface of the n-type semiconductor layer, the p-type semiconductor layer having an upper surface; a protective film continuously covering the n-type semiconductor layer and the p-type semiconductor layer, the protective film defining an n-side opening at the upper surface of the n-type semiconductor layer and a p-side opening at an upper surface of the p-type semiconductor layer; a p-side electrode on the upper surface of the p-type semiconductor layer that is exposed in the p-side opening; an n-side electrode on the upper surface of the n-type semiconductor layer that is exposed at the n-side opening, n-side electrode having an n-side light-transmissive electrode; and an n-side pad electrode on the upper surface of the n-side light-transmissive electrode.

A method of manufacturing a light emitting device according to certain embodiments of the present invention may include providing a semiconductor layered body having an n-type semiconductor layer, a p-type semiconductor layer on a portion of an upper surface of the n-type semiconductor layer; forming a light-transmissive electrode on the semiconductor layered body, forming an n-side resist layer and a p-side resist layer respectively on each corresponding regions on the n-type semiconductor layer and the p-type semiconductor layer; forming an n-side light-transmissive electrode and a p-side light-transmissive electrode by removing exposed portions of the light-transmissive electrode that are not covered by the n-side resist layer and the p-side resist layer; covering upper surfaces of exposed semiconductor layered body that are not covered by the light-transmissive electrode, an upper surface of the n-side resist layer, and an upper surface of the p-side resist layer with a protective film; removing the protective film on the n-side resist layer and on the p-side resist layer, n-side resist layer, and p-side resist layer; and disposing an n-side pad electrode and a p-side pad electrode on the upper surface of the n-side light-transmissive electrode and on the upper surface of the p-side light-transmissive electrode, respectively.

In the light emitting element described above, the upper surface of the n-side light-transmissive electrode is exposed from the protective film, so that the light extraction efficiency can be further improved. Further, the resist layer used in forming the n-side light-transmissive electrode and the p-side light-transmissive electrode can also be used as it is in forming the protective film, so that manufacturing of the light emitting element can be simplified.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION

Figure 1:
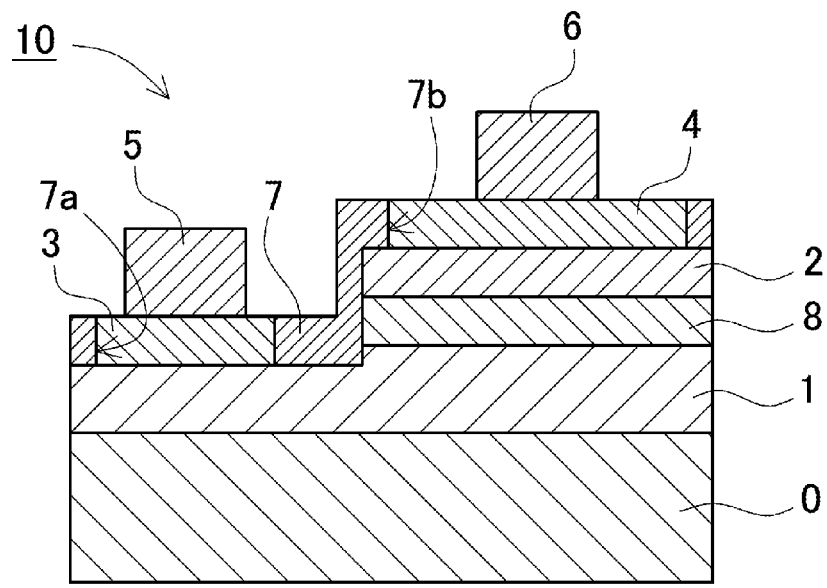
FIG. 1 is a partial cross-sectional view at line I-I shown in FIG. 2 of a light emitting device according to a first embodiment.

The embodiments according to the present invention will be described below with reference to the drawings. The preferred embodiments are intended as illustrative of a phosphor and a light emitting device using the same, and a method of manufacturing the phosphor to give a concrete form to technical ideas of the present invention, and the scope of the invention is not limited to those described below. The sizes and the arrangement relationships of the members in each of drawings are occasionally shown exaggerated for ease of explanation. In the description below, the same designations or the same reference numerals denote the same or like members and duplicative descriptions will be appropriately omitted. In addition, each component included in the embodiments and examples according to the present invention may be such that a plurality of components may be configured as a single member that serves the purpose of a plurality of components, or alternatively, function of a single component may be obtained with a plurality of components. Description given in some examples and some embodiments can also be applied in other examples and embodiments. In the specification, the term "on", such as used in "on the layer" etc. includes not only a case where a component is in contact with an upper surface of the layer, but also a case where a component is located above, spaced apart from the upper surface of the layer, which includes a case where there is another layer between the layers.

Embodiment 1

Figure 2:
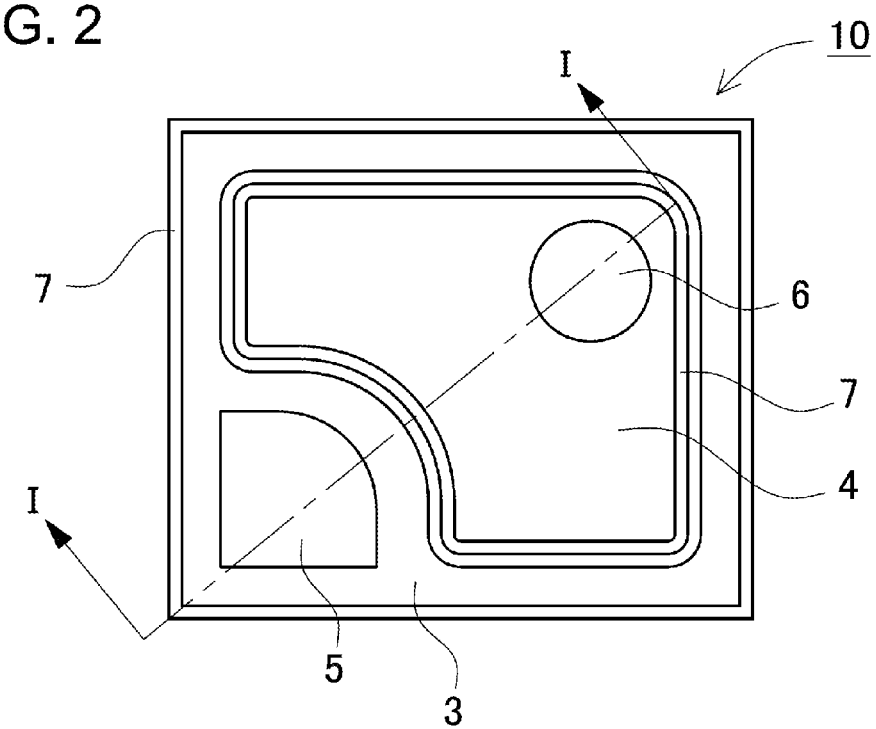
FIG. 2 is a schematic plan perspective view of the light emitting device in FIG. 1.

FIG. 1 is a schematic cross-sectional view and FIG. 2 is a schematic plan view of a light emitting element according to a first embodiment. The light emitting element 10 shown in FIG. 1 and FIG. 2 includes a growth substrate 0, an n-type semiconductor layer 1 layered on an upper surface of the growth substrate, an active layer 8, a p-type semiconductor layer 2, an n-side electrode (an n-side light-transmissive electrode 3 and an n-side pad electrode 5), a p-side electrode (a p-side light-transmissive electrode 4 and a p-side pad electrode 6), and a protective film 7.

The n-type semiconductor layer 1, the active layer 8, and the p-type semiconductor layer 2 are layered in this order from the growth substrate 0 side. The n-side electrode and the p-side electrode are arranged on a same surface side, i.e., the p-side semiconductor layer 2 is arranged above a portion of an upper layer of the n-type semiconductor layer 1 via the active layer 8.

Protective Film 7

The protective film 7 at least partially covers the exposed upper surface of the n-type semiconductor layer 1 and the exposed upper surface of the p-type semiconductor layer 2. The protective film 7 forms an n-side opening 7a on the upper surface on the n-type semiconductor layer 1 and a p-side opening 7b on the upper surface of the p-type semiconductor layer 2. The protective film 7 also covers lateral surfaces of the n-type semiconductor layer 1 and the lateral surfaces of the p-type semiconductor layer 2. Particularly, portions between the n-type semiconductor layer 1 and the p-type semiconductor layer 2, that is, the lateral surfaces of the n-type semiconductor layer 1, lateral surfaces of the active layer 8, and the lateral surfaces of the p-type semiconductor layer 2 are continuously covered by the protective film 7. As described above, the lateral surfaces of each of the semiconductor layers are covered by the protective film 7, while the upper surfaces of the light-transmissive electrodes 3, 4 that are formed on the respective semiconductor layers are exposed from the protective film 7. The protective film has a thickness so that each semiconductor layer can be protected from the external environment, and for example, a thickness in a range of 10 nm to 1000 nm is preferable, and 100 nm to 300 nm is more preferable.

The p-side electrode is arranged on the upper surface of the p-type semiconductor layer that is exposed at the p-side opening 7b. The p-side electrode includes a p-side light-transmissive electrode 4 arranged on an upper surface of the p-type semiconductor layer 2 and a p-side pad electrode 6 arranged on an upper surface of the p-side light-transmissive electrode 4. Thus, providing a region that is not covered by the protective film 7 also on the p-side light-transmissive electrode 4 allows for a further improvement in the light extraction efficiency at the p-side as well as at the n-side.

Meanwhile, the n-side light-transmissive electrode 3 is arranged on the upper surface of the n-type semiconductor layer 1 that is exposed at the n-side opening 7a. In this case, the lateral peripheral edges of the n-side light-transmissive electrode 3 are preferably in contact with the side surfaces of the n-side opening 7a. With this configuration, occurrence of a gap between the n-side light-transmissive electrode 3 and the protective film 7 can be prevented, so that the semiconductor layers can be protected from the external environment. The n-side pad electrode 5 is arranged on the upper surface of the n-side light-transmissive electrode 3.

n-Side Light-Transmissive Electrode 3

The n-side light-transmissive electrode 3 is, as shown in FIG. 2, in a plan view, arranged to surround the p-type semiconductor layer 2. This configuration allows for a more uniform supply of electric current from the n-side light-transmissive electrode 3 to the active layer 8 and the p-type semiconductor layer 2, so that uneven light emission can be reduced. Also, an area of the n-side light-transmissive electrode 3 exposed from the protective film 7 can be increased, so that the light extraction efficiency can be further increased. The n-side light-transmissive electrode 3 preferably has a refractive index lower than that of the n-type semiconductor layer 1 with respect to light emitted from the light emitting element 10. This arrangement allows for a reduction in the amount of light emitted from the active layer 8 reflected by the interface between the n-type semiconductor layer 1 and the n-side light-transmissive electrode 3, so that the light extraction efficiency particularly near the n-type semiconductor layer can be improved.

The n-side light-transmissive electrode 3 can be formed with ITO or the like. Further, in order to improve the light extraction efficiency, the n-side light-transmissive electrode 3 has a thickness preferably in a range of 30 nm to 110 nm, more preferably in a range of 70 nm to 80 nm.

Further, at a region on the n-type semiconductor layer 1 where the n-side electrode is not provided, for example, the region NA (e.g., street regions along which singulation of the light emitting elements takes place) where the n-side light-transmissive electrode 3 and the n-side pad electrode 5 that are shown in FIG. 2 are not provided, the n-side light-transmissive electrode 3 is arranged not only on the region, in a plan view shown in FIG. 2, proximity to the n-side pad-electrode 5 but also extended to other regions, for example, extended to the periphery of the p-side electrode (particularly near the p-side light-transmissive electrode 4). Thus, such a region on the n-type semiconductor layer 1 where the n-side electrode is not provided can also contribute to an improvement in light extraction. That is, the protective film 7 is, as shown in FIG. 1, needed to be arranged on the lateral surfaces of the semiconductor layer, more specifically, at least on the region between the p-type semiconductor layer 2 and the n-type semiconductor layer 1. But an improvement in the optical output can be achieved without arranging the protective film 7 on the upper surface of the n-side light-transmissive electrode 3 and the upper surface of the p-side light-transmissive electrode 4.

Light Emitting Device

Figure 3:
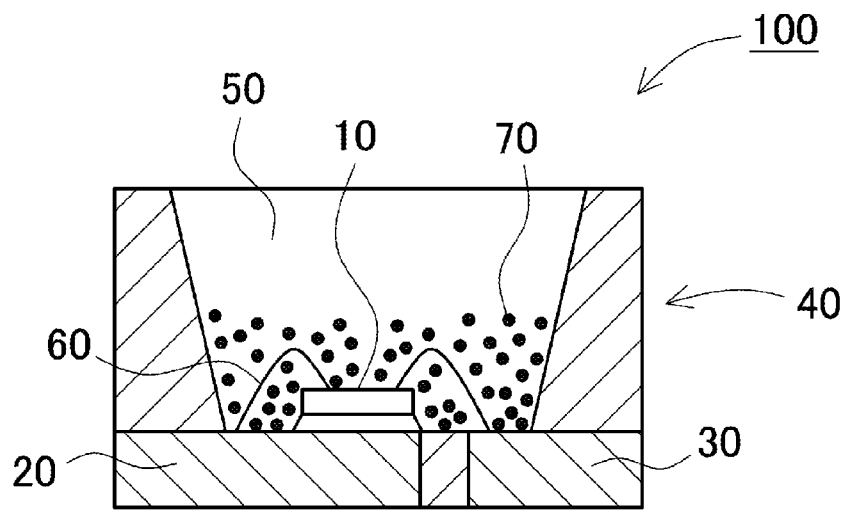
FIG. 3 is a partial cross-sectional view of a light emitting device according to the first embodiment.
Figure 4:
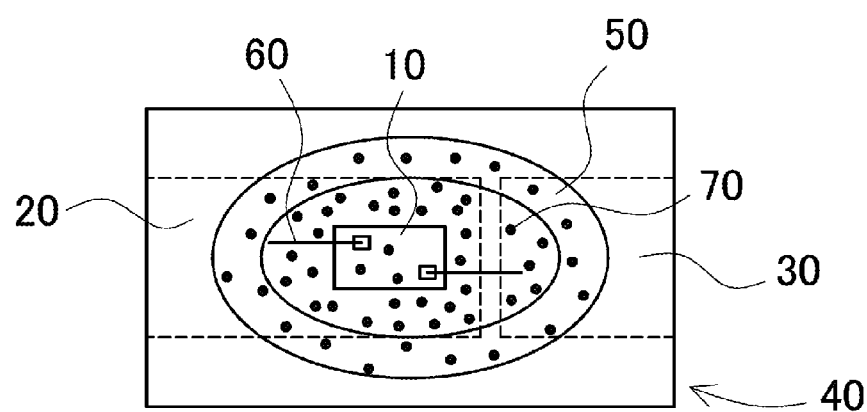
FIG. 4 is a schematic plan view of the light emitting device of FIG. 3.

For the light emitting devices having such an light emitting element as described above, various types, for example, so-called "lamp type" and "surface-mounting type" can be employed. Next, a light emitting device 100 shown in FIG. 3 and FIG. 4 will be described as an example of the light emitting device. The light emitting device 100 includes a light emitting element 10 (light source) which is a gallium nitride-based compound semiconductor to emit a short-wavelength visible light (for example, 380 nm to 485 nm), and a molded body 40 where the light emitting element 10 is mounted. The molded body 40 includes a first lead 20 and a second lead 30 and is integrally molded with a thermoplastic resin or a thermosetting resin. A recess defined by a bottom surface and one or more side surfaces is formed in the molded body 40 and the light emitting element 10 is mounted on the bottom surface defining the recess. The light emitting element 10 has a pair of positive and negative electrodes and the pair of electrodes are respectively electrically connected with the first lead 20 and the second lead 30 through respective wires 60. The light emitting element 10 is sealed with a sealing member 50. The sealing member 50 may contain a fluorescent material 70 to convert the wavelength of the light emitted from the light emitting element 10. The fluorescent material 70 is arranged so as to be unevenly present in the sealing member 50, which allows for the phosphor close to the light emitting element 10 that allows efficient wavelength conversion of light emitted from the light emitting element 10, and a light emitting device having excellent luminous efficiency can be obtained. The relative arrangement between the member which contains the phosphor and the light emitting element is not limited to that in which the both are disposed closely. In view of thermal effect on the phosphor, the light emitting element and the wavelength converting member which contains the phosphor can be arranged spaced apart from each other. Also, in order to obtain light of even color, the phosphor 70 may be mixed in the sealing member 50 approximately uniformly.

Sealing Member 50

In the present embodiment, the sealing member 50 preferably has a refractive index lower than that of the n-side light-transmissive electrode 3 with respect to light emitted from the light emitting element 10. This arrangement allows for a reduction in the amount of light emitted from the active layer 8 reflected by the interface between the n-side light-transmissive electrode 3 and the sealing member 50, so that the light extraction efficiency particularly near the n-side light-transmissive electrode 3 can be improved. For such a sealing member 50, a silicone resin and an epoxy resin that have good weather resistance can be suitably used.

Method of Manufacturing Light Emitting Element

Figure 5:
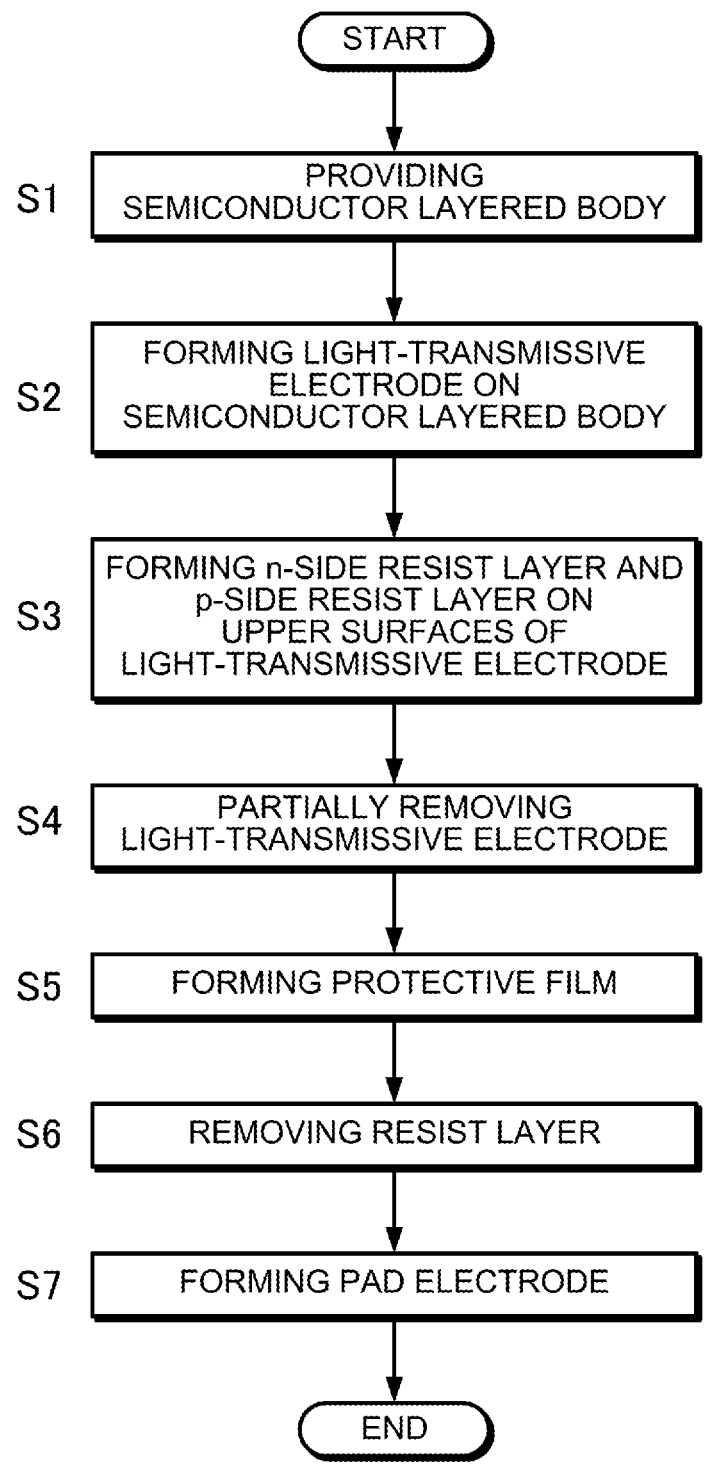
FIG. 5 is a flowchart illustrating a method of manufacturing a light emitting element.
Figure 6:
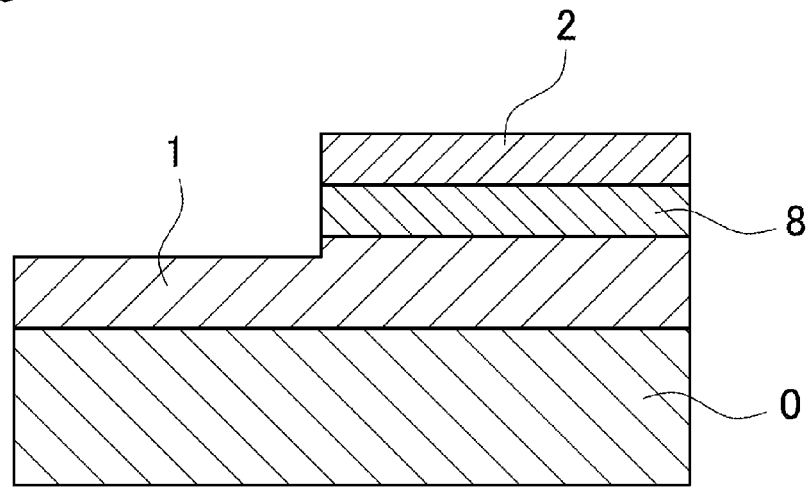
FIG. 6 is a schematic cross-sectional view illustrating a step in manufacturing a light emitting element.
Figure 13:
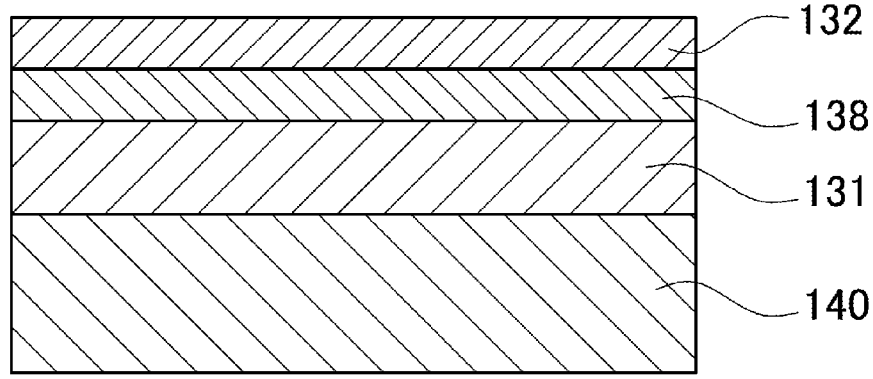
FIG. 13 is a schematic cross-sectional view illustrating a step in manufacturing a related art light emitting element.
Figure 14:
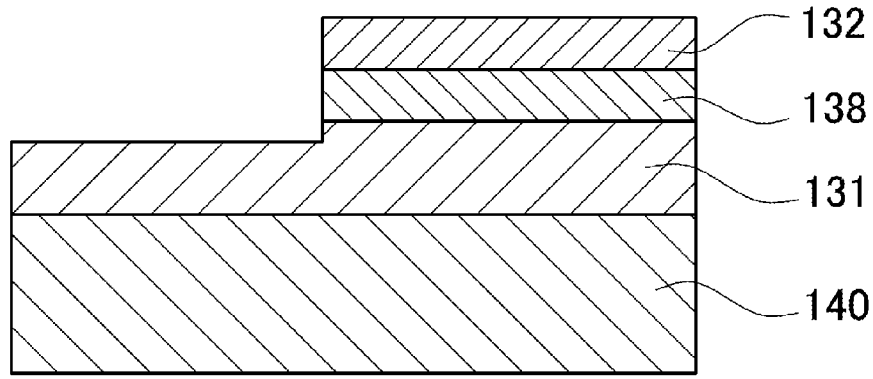
FIG. 14 is a schematic cross-sectional view illustrating a step in manufacturing a related art light emitting element.

Next, a method of manufacturing a light emitting element will be described with reference to the flowchart of FIG. 5, and to FIG. 6 to FIG. 9, and FIG. 1. First, in the step of providing a semiconductor layered body, as shown in FIG. 6, a semiconductor stacked layer body is provided. In the present embodiment, an n-type semiconductor layer 1, an active layer 8, and a p-type semiconductor layer 2 are layered in this order on the growth substrate 0. For the growth substrate 0, a sapphire substrate or the like can be suitably used. Then, the active layer 8 and the p-type semiconductor layer 2 are partially removed by etching or the like. Thus, the semiconductor stacked layer body in which the p-type semiconductor layer 2 is arranged above a portion of the n-type semiconductor layer 1 can be obtained. Similar procedure illustrated in FIG. 13 and FIG. 14 can be used in the procedure described above. For each semiconductor layer, for example, a nitride-based semiconductor (for example, $In_XAl_YGa_{1-X-Y}N$, $0 \leq X$, $0 \leq Y$, $X+Y \leq 1$) can be used. The obtained light emitting element can emit visible light in a short-wavelength range of 380 nm to 485 nm. The peak wavelength of the emission is preferably in a range of 400 nm to 470 nm, and more preferably in a range of 410 nm to 460 nm.

Figure 15:
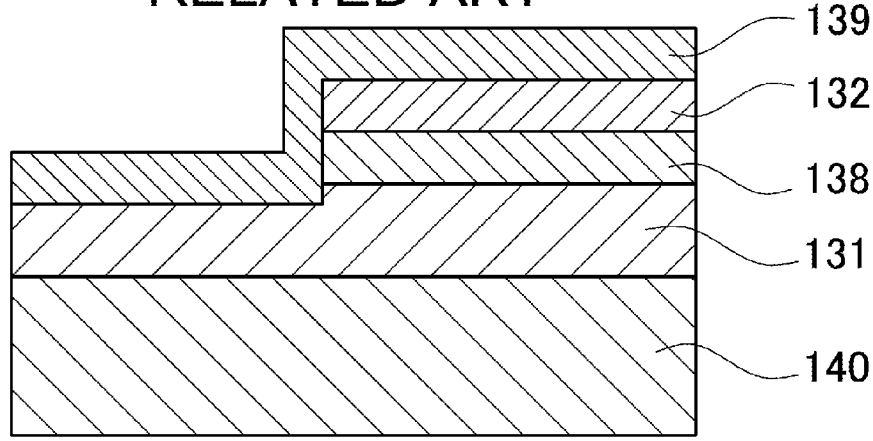
FIG. 15 is a schematic cross-sectional view illustrating forming a protective film in a step in manufacturing a related art light emitting element.

Next, in the step of forming a light-transmissive electrode on the semiconductor layered body, a light-transmissive electrode is formed on the semiconductor layered body. In the present embodiment, as the light-transmissive electrode, an ITO layer is formed on approximately entire surfaces on the semiconductor stacked layer body. Similar procedure illustrated in FIG. 15 can be used in the procedure described above.

Figure 16:
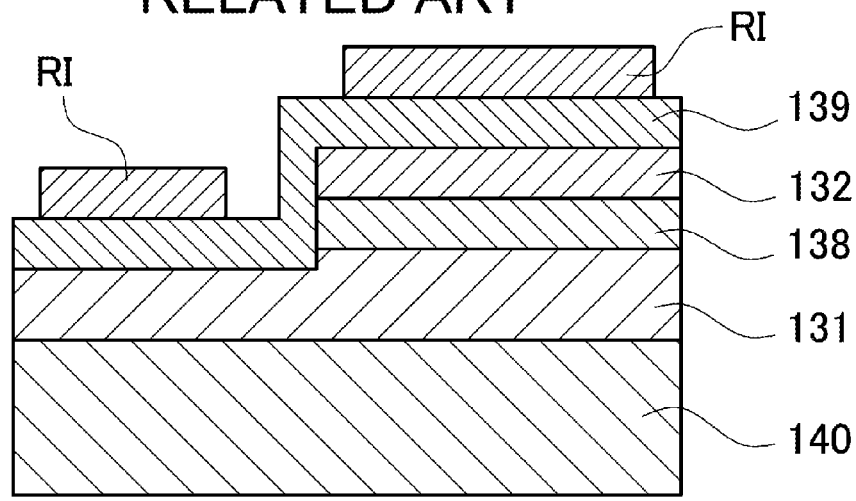
FIG. 16 is a schematic cross-sectional view illustrating forming a protective film in a step in manufacturing a related art light emitting element.
Figure 17:
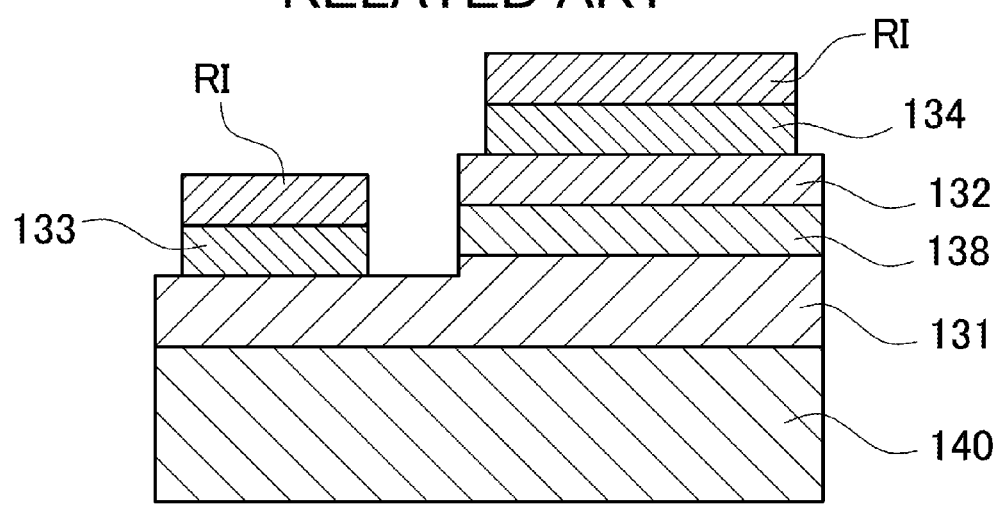
FIG. 17 is a schematic cross-sectional view illustrating a step in manufacturing a related art light emitting element.
Figure 18:
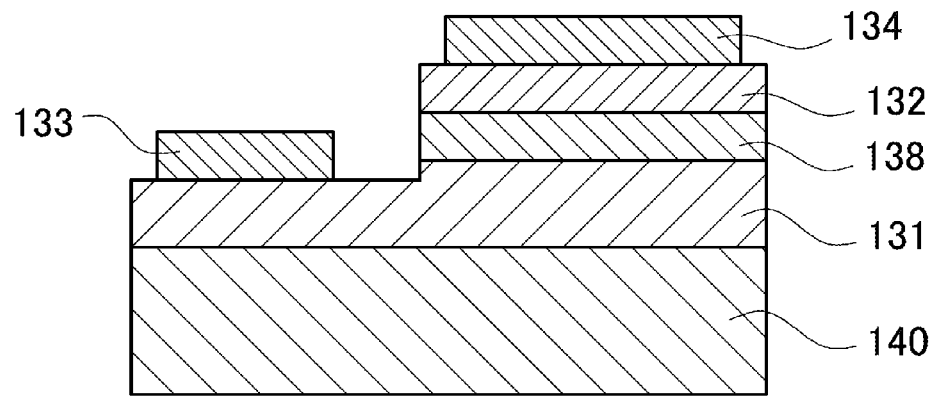
FIG. 18 is a schematic cross-sectional view illustrating a step in manufacturing a related art light emitting element.
Figure 19:
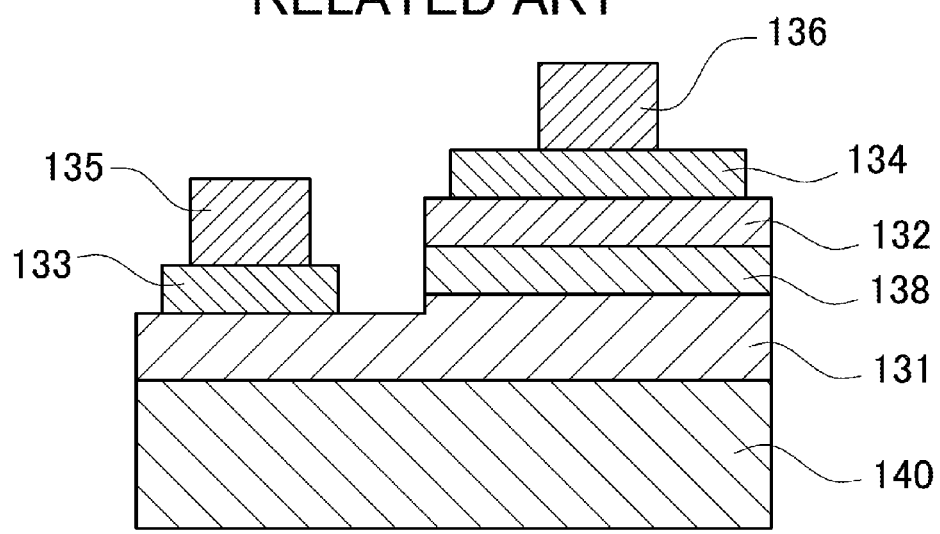
FIG. 19 is a schematic cross-sectional view illustrating a step in manufacturing a related art light emitting element.
Figure 20:
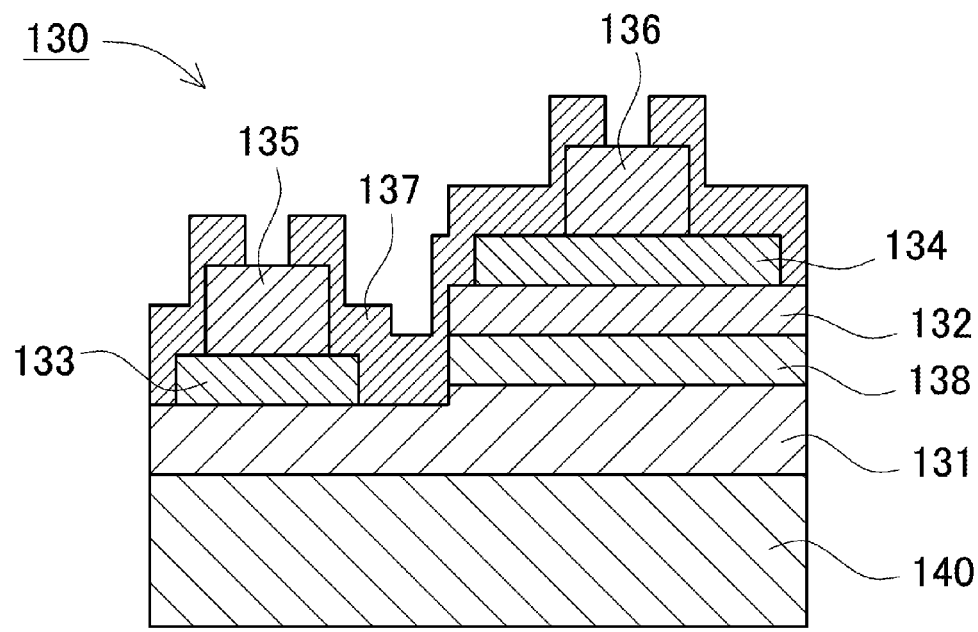
FIG. 20 is a schematic cross-sectional view illustrating a step in manufacturing a related art light emitting element.

Next, in the step of forming an n-side resist layer and p-side resist layer on upper surfaces of the light-transmissive electrode, an n-side resist layer RN and a p-side resist layer RP are formed on upper surfaces of the light-transmissive electrode, respectively at regions above the n-type semiconductor layer 1 and above the p-type semiconductor layer 2, that is, at regions for forming an n-side opening 7a and a p-side opening 7b. That is, the n-side resist layer RN and the p-side resist layer RP are formed on the predetermined regions of the n-type semiconductor layer 1 and the p-type semiconductor layer 2 so that portions of the light-transmissive electrode on the n-type semiconductor layer 1 and the p-type semiconductor layer 2 other than the predetermined regions are removed to leave only the predetermined regions. Similar procedure illustrated in FIG. 16 can be used in the procedure described above.

Figure 7:
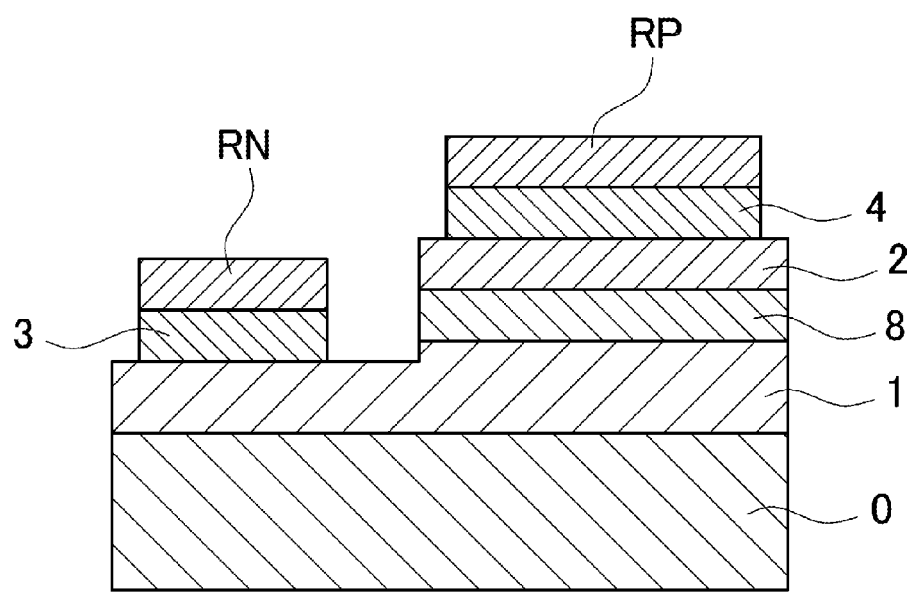
FIG. 7 is a schematic cross-sectional view illustrating a step in manufacturing a light emitting element.

Next, in the step of partially removing the light-transmissive electrode, the portions of the light-transmissive electrode exposed from the n-side resist layer RN and the p-side resist layer RP are removed. Accordingly, as shown in FIG. 7, the n-side light-transmissive electrode 3 and the p-side light-transmissive electrode 4 are formed.

Figure 8:
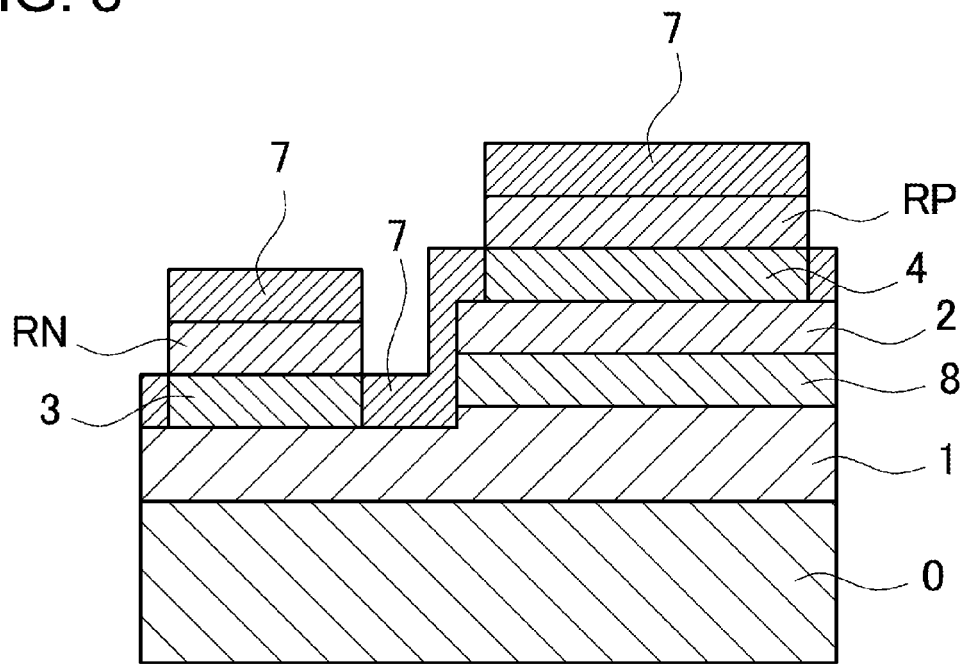
FIG. 8 is a schematic cross-sectional view illustrating a step in manufacturing a light emitting element.

In this state, without removing the resist layer, in the successive step of forming a protective film, as shown in FIG. 8, the surfaces of the semiconductor stacked layer body that are exposed by removing the portions of the light-transmissive electrode and the upper surfaces of the resist layers are covered with the protective film 7. For the protective film 7, a SiO$_2$ layer or the like can be suitably used.

Figure 9:
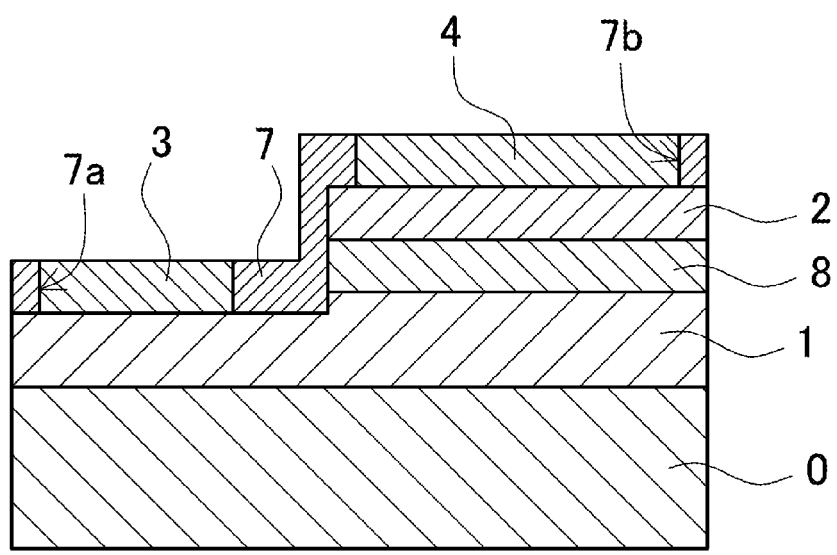
FIG. 9 is a schematic cross-sectional view illustrating a step in manufacturing a light emitting element.

Further, in the step of removing the resist layer, as shown in FIG. 9, the n-side resist layer RN and the p-side resist layer RP are removed to remove the protective film 7 on each of the resist layers. Accordingly, patterning of the n-side light-transmissive electrode 3 and the p-side light-transmissive electrode 4 and patterning of the protective film 7 can be performed using a common resist layer.

In the step of forming pad electrodes, an n-side pad electrode 5 and a p-side pad electrode 6 are disposed on the upper surface of the n-side light-transmissive electrode 3 and on the upper surface of the p-side light-transmissive electrode 4, respectively. With this, the light emitting elements 10 shown in FIG. 1 can be obtained. According to the method described above, the resist layer can be used both for patterning the n-side light-transmissive electrode 3 and the p-side light-transmissive electrode 4 and for patterning the protective film 7. Thus, reduction of the steps in photolithography processing can be achieved, and simplification of manufacturing steps, reduction of tact time, and reduction of manufacturing costs can be realized. Further, particularly on the n-side semiconductor layer, as shown in a plan view of FIG. 2, the n-side light-transmissive electrode 3 can be arranged not only around the n-side pad electrode 5 but also extended upward direction in the figure, and further surrounding the p-side electrode so that the n-side pad electrode 5 is extended to the lateral surfaces of the p-side electrode. Moreover, the protective film 7 is absent on the upper surface of the n-side light-transmissive electrode 3, so that absorption or scattering of light transmitting through the protective film 7 can be greatly reduced, and an improvement in the light extraction efficiency as a whole can also be achieved.

Embodiment 2

Figure 21:
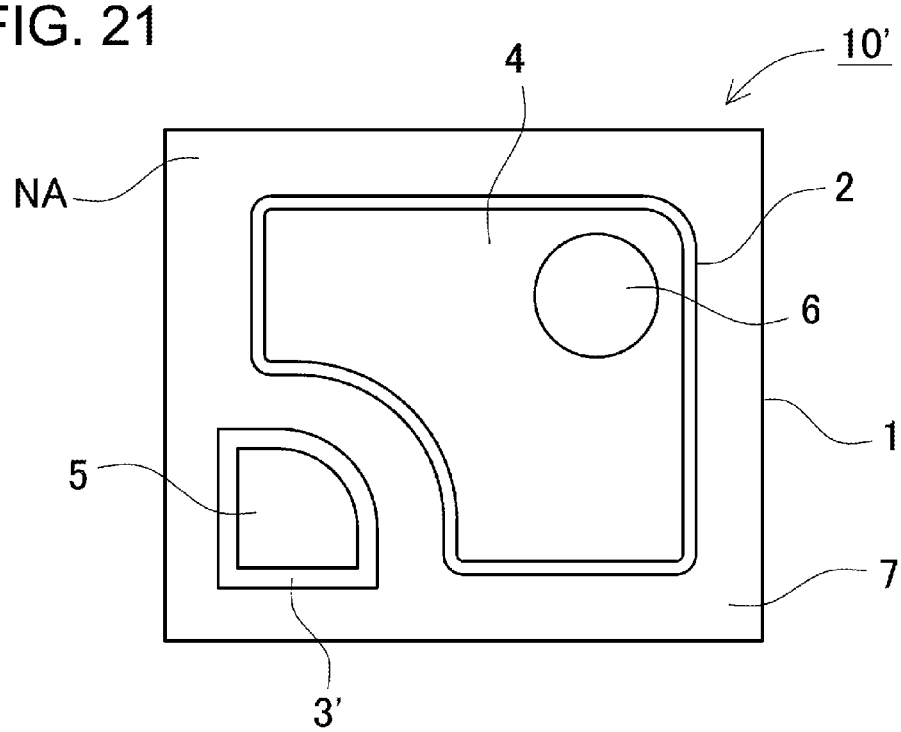
FIG. 21 is a schematic plan view of a light emitting device according to a second embodiment.

The examples shown in FIG. 2 etc. illustrate a configuration that includes the n-side light-transmissive electrode 3 arranged surrounding the p-side electrode. However, the present invention is not limited to the configuration described above, and the n-side light-transmissive electrode may be arranged only in the region proximity to the n-side pad electrode. Such an example is illustrated in a plan view of FIG. 21 as Embodiment 2. The light emitting element 10' shown in FIG. 21 includes the n-side light-transmissive electrode 3' such as an ITO layer that is arranged only in the region proximity to the n-side pad electrode 5. The p-electrode in Embodiment 2 may have a similar configuration as in the light emitting element 10 shown in FIG. 2 etc.

Figure 10:
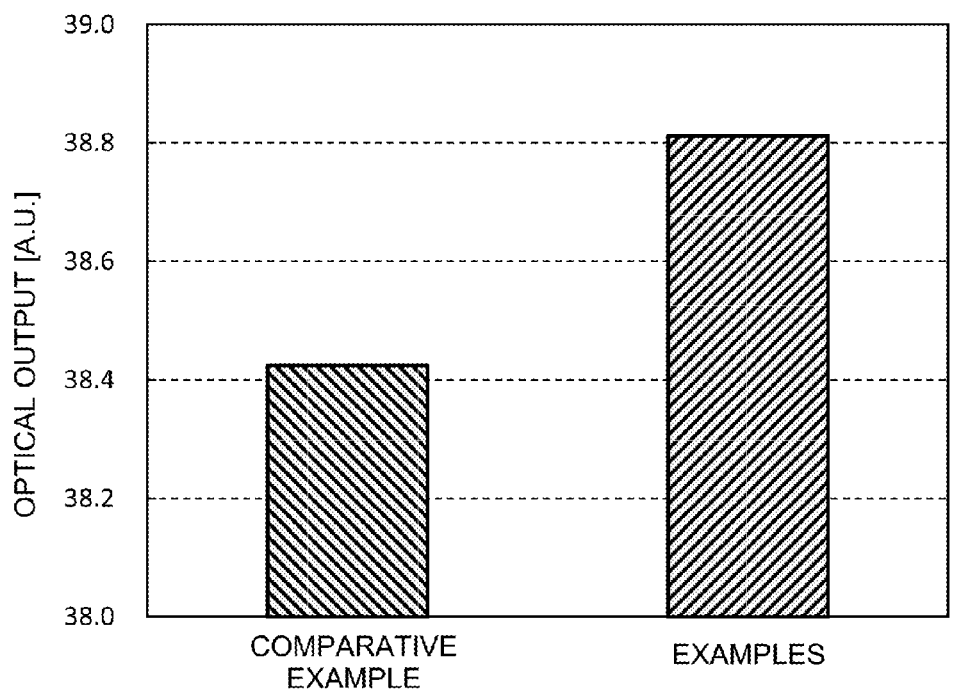
FIG. 10 is a graph showing the comparison of optical output of the light emitting elements according to one example and a comparative example.

The optical output of the light emitting element formed as Comparative Example according to the method of manufacturing shown in FIG. 13 to FIG. 20 and the light emitting element 10' of Example formed according to the method of manufacturing shown in FIG. 6 to FIG. 9 are compared and the result is shown in the diagram of FIG. 10. In the light emitting elements of both Example and Comparative Example, a light-transmissive electrode of an ITO layer is layered with a thickness of 110 nm, and a protective film of a SiO$_2$ layer is layered with a thickness of 200 nm, respectively. As shown in FIG. 10, a higher optical output is confirmed in Example compared to that in Comparative Example.

Figure 11:
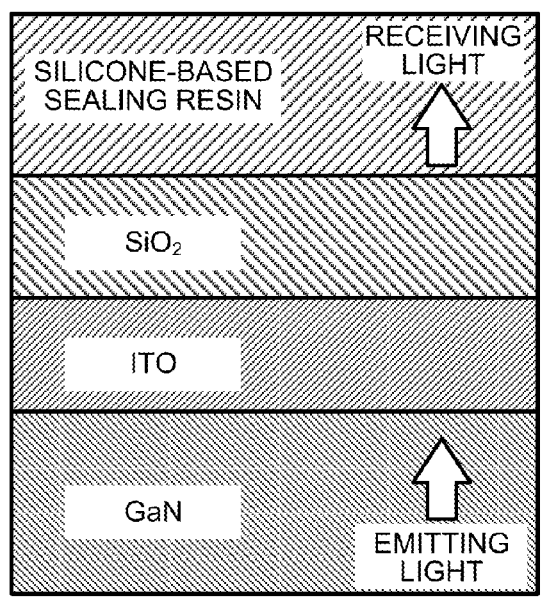
FIG. 11 is a schematic cross-sectional view showing a layered structure model used in simulation.
Figure 12:
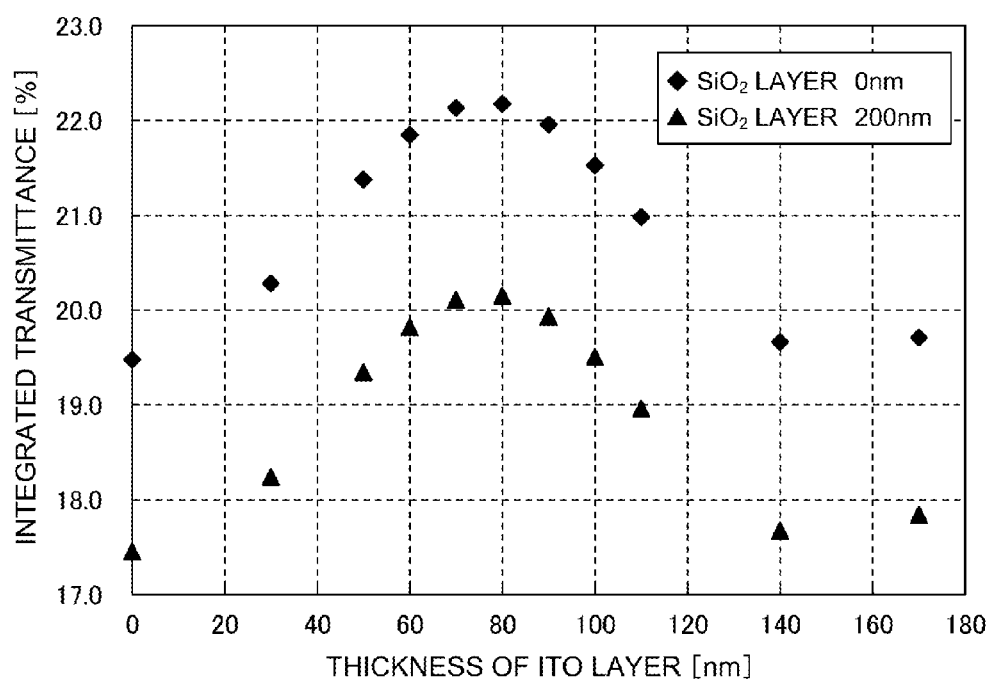
FIG. 12 is a diagram showing a simulation result of integrated transmittance of each $SiO_2$ layer as a function of the thickness of the ITO layer, obtained by calculation based on the layered structure model shown in FIG. 11.

Further, the effect of improvement in the light extraction efficiency is confirmed in a light emitting device in which the light emitting element that includes a light-transmissive electrode exposed from the protective film is sealed in a sealing member. FIG. 12 is a diagram showing a simulation results of transmittance of light transmitting through the sealing member, obtained by calculation, based on the model shown in FIG. 11, which employs a GaN layer for the semiconductor layer, an ITO layer for the light-transmissive electrode, a SiO$_2$ layer for the protective film, and a silicone-cased sealing resin for the sealing member. In FIG. 12, the integrated transmittance of each SiO$_2$ layer with a thickness of 0 nm and 200 nm as a function of the thickness of the ITO layer is obtained by calculation. In the model, each member is set to have a refractive index. That is, n=2.41 for the GaN layer, n=1.97 for the ITO layer, and n=1.48 for the SiO$_2$ layer. As shown in FIG. 12, with the thickness 0 Å of the SiO$_2$ layer, that is, in the absence of the protective film, a significant result was confirmed. Meanwhile, a thickness of the ITO layer greater than 0 nm, that is, the presence of the light-transmissive electrically conductive film is determined preferable. Particularly, the ITO layer preferably has a thickness that allows for a higher integrated transmittance compared to the case in the presence of the SiO$_2$ layer, so that a thickness in a range of 30 nm to 110 nm is preferable and 70 nm to 80 nm is more preferable.

The light emitting element and a light emitting device using the light emitting element, and a method of manufacturing the same according to the embodiments of the present invention can be suitably applied to backlight light sources, light sources for lighting, headlights, displays having light emitting elements arranged in a dot-matrix manner as their light source, signaling devices, pilot light switches, various sensors used in image scanners or the like, and various indicators.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a light emitting element comprising:
   providing a semiconductor layered body having an n-type semiconductor layer, a p-type semiconductor layer on a portion of an upper surface of the n-type semiconductor layer;
   forming a light-transmissive electrode on the semiconductor layered body,
   forming an n-side resist layer and a p-side resist layer respectively on each corresponding regions on the n-type semiconductor layer and the p-type semiconductor layer;
   forming an n-side light-transmissive electrode and a p-side light-transmissive electrode by removing exposed portions of the light-transmissive electrode that are not covered by the n-side resist layer and the p-side resist layer;
   covering upper surfaces of exposed semiconductor layered body that are not covered by the light-transmissive electrode, an upper surface of the n-side resist layer, and an upper surface of the p-side resist layer with a protective film;
   removing the protective film on the n-side resist layer and on the p-side resist layer, n-side resist layer, and p-side resist layer; and
   disposing an n-side pad electrode and a p-side pad electrode on the upper surface of the n-side light-transmissive electrode and on the upper surface of the p-side light-transmissive electrode, respectively.

2. The method of manufacturing a light emitting element according to claim 1, wherein, in forming the n-side light-transmissive electrode and the p-side light-transmissive electrode by removing exposed portions of the light-transmissive electrode that are not covered by the n-side resist layer and the p-side resist layer, lateral peripheral edges of the n-side light-transmissive electrode are in contact with the lateral surface of the n-side opening.

3. The method of manufacturing a light emitting element according to claim 1, wherein, in forming the n-side light-transmissive electrode and the p-side light-transmissive electrode by removing exposed portions of the light-transmissive electrode that are not covered by the n-side resist layer and the p-side resist layer, the n-side light-transmissive electrode is arranged surrounding the p-type semiconductor layer in a plan view.

4. The method of manufacturing a light emitting element according to claim 1, wherein, in forming the n-side light-transmissive electrode and the p-side light-transmissive electrode by removing exposed portions of the light-transmissive electrode that are not covered by the n-side resist layer and the p-side resist layer refractive index of the n-side light-transmissive electrode is smaller than that of the n-type semiconductor layer with respect to light emitted from the light emitting element.

5. The method of manufacturing a light emitting element according to claim 1, wherein, in forming the n-side light-transmissive electrode and the p-side light-transmissive electrode by removing exposed portions of the light-transmissive electrode that are not covered by the n-side resist layer and the p-side resist layer, the n-side light-transmissive electrode is ITO.

6. The method of manufacturing a light emitting element according to claim 1, wherein, in forming the n-side light-transmissive electrode and the p-side light-transmissive electrode by removing exposed portions of the light-transmissive electrode that are not covered by the n-side resist layer and the p-side resist layer, the n-side light-transmissive electrode has a thickness in a range of 30 nm to 110 nm.

* * * * *